United States Patent
Lee et al.

(10) Patent No.: US 12,360,169 B2
(45) Date of Patent: Jul. 15, 2025

(54) DISCONNECTION TESTING APPARATUS FOR ELECTRODE TAB OF BATTERY CELL

(71) Applicant: LG ENERGY SOLUTION, LTD., Seoul (KR)

(72) Inventors: Ju Mi Lee, Daejeon (KR); Ju Young Kim, Daejeon (KR); In Hwan Cho, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 0 days.

(21) Appl. No.: 18/273,921

(22) PCT Filed: Oct. 18, 2022

(86) PCT No.: PCT/KR2022/015899
§ 371 (c)(1),
(2) Date: Jul. 24, 2023

(87) PCT Pub. No.: WO2023/075273
PCT Pub. Date: May 4, 2023

(65) Prior Publication Data
US 2024/0110990 A1    Apr. 4, 2024

(30) Foreign Application Priority Data

Oct. 25, 2021   (KR) ........................ 10-2021-0142779

(51) Int. Cl.
G01R 31/389    (2019.01)
G01R 31/385    (2019.01)

(52) U.S. Cl.
CPC ....... *G01R 31/389* (2019.01); *G01R 31/3865* (2019.01)

(58) Field of Classification Search
None
See application file for complete search history.

(56) References Cited

U.S. PATENT DOCUMENTS

| 6,215,311 B1 | 4/2001 | Miyamoto et al. |
| 2012/0145564 A1 | 6/2012 | Yamazaki et al. |

(Continued)

FOREIGN PATENT DOCUMENTS

| JP | 11-176465 A | 7/1999 |
| JP | 2003-215190 A | 7/2003 |

(Continued)

OTHER PUBLICATIONS

Extended European Search Report for European Application No. 22887469.9, dated Aug. 9, 2024.

(Continued)

*Primary Examiner* — Jas A Sanghera
(74) *Attorney, Agent, or Firm* — Birch, Stewart, Kolasch & Birch, LLP

(57) ABSTRACT

Discussed is an electrode tab disconnection inspection apparatus of a battery cell that can include an impedance measurement part connected to electrode leads of a battery cell to be inspected, and configured to measure an impedance value according to a frequency of the battery cell; and a determination part configured to compare impedance value data according to the frequency of the battery cell to be inspected acquired by the impedance measurement part and a predetermined impedance value data group according to a frequency of normal battery cells having no disconnected electrode tabs or a frequency of tab disconnected battery cells having disconnected electrode tabs to determine whether the electrode leads of the battery cell to be inspected is disconnected.

15 Claims, 13 Drawing Sheets

(56) References Cited

U.S. PATENT DOCUMENTS

| | | |
|---|---|---|
| 2017/0322168 A1 | 11/2017 | Lupienski et al. |
| 2017/0348804 A1 | 12/2017 | Cai et al. |
| 2018/0254641 A1* | 9/2018 | Kadirvel ............... H02J 7/0031 |
| 2019/0072947 A1 | 3/2019 | Park et al. |
| 2019/0140590 A1 | 5/2019 | Yura et al. |
| 2020/0011015 A1 | 1/2020 | Mijatovic et al. |
| 2020/0366103 A1 | 11/2020 | Zhou et al. |
| 2022/0381840 A1 | 12/2022 | Heo et al. |

FOREIGN PATENT DOCUMENTS

| | | |
|---|---|---|
| JP | 5090413 B2 | 12/2012 |
| JP | 5138160 B2 | 2/2013 |
| JP | 2015-109148 A | 6/2015 |
| JP | 5975274 B2 | 8/2016 |
| JP | 2019-160775 A | 9/2019 |
| JP | 2023-550095 A | 11/2023 |
| JP | 2024-500140 A | 1/2024 |
| JP | 2024-510340 A | 3/2024 |
| JP | 7501831 B2 | 6/2024 |
| KR | 10-2012-0064630 A | 6/2012 |
| KR | 10-2017-0125707 A | 11/2017 |
| KR | 10-2019-0025473 A | 3/2019 |
| KR | 10-2019-0125906 A | 11/2019 |
| KR | 10-2020-0023672 A | 3/2020 |
| KR | 10-2020-0035594 A | 4/2020 |
| KR | 10-2151175 B1 | 9/2020 |
| KR | 10-2021-0107997 A | 9/2021 |
| KR | 10-2022-0020506 A | 2/2022 |
| KR | 10-2022-0028267 A | 3/2022 |
| KR | 10-2022-0169787 A | 12/2022 |
| WO | WO 2020/009337 A1 | 1/2020 |

OTHER PUBLICATIONS

International Search Report (PCT/ISA/210) issued in PCT/KR2022/015899, dated Feb. 2, 2023.

* cited by examiner

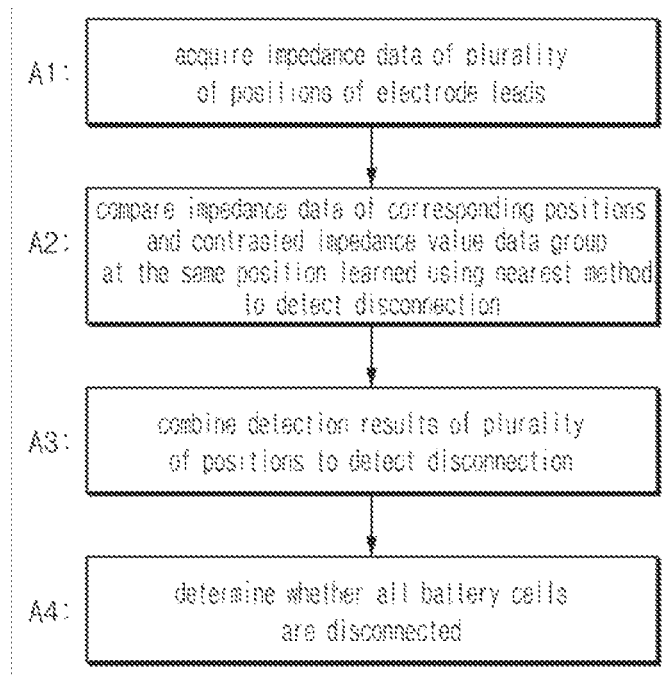

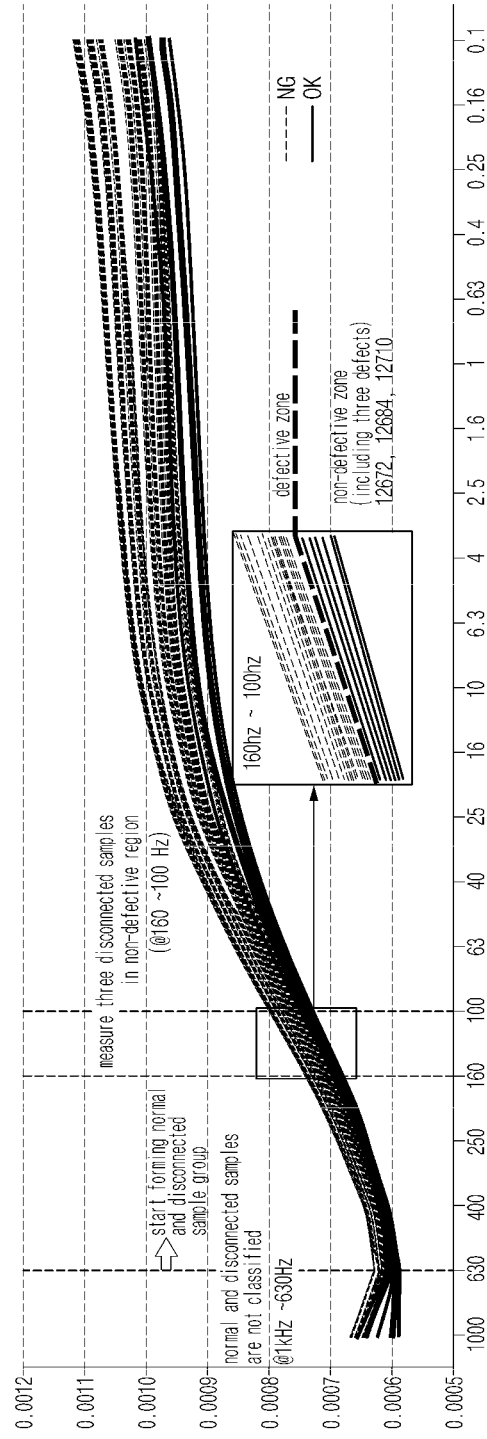
[FIG. 9]

[FIG. 10]
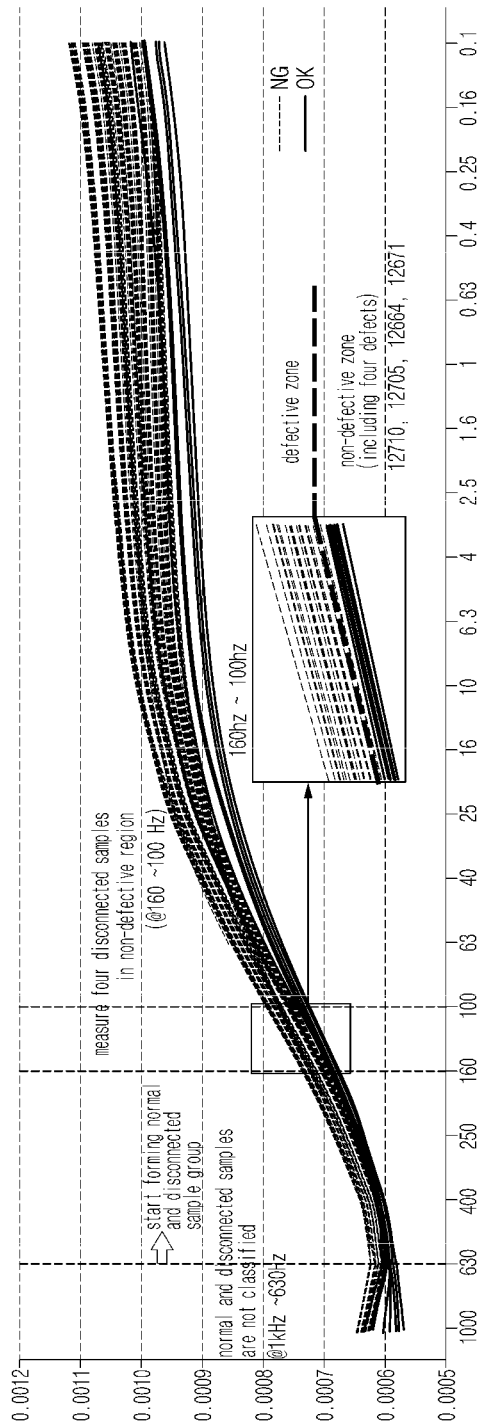

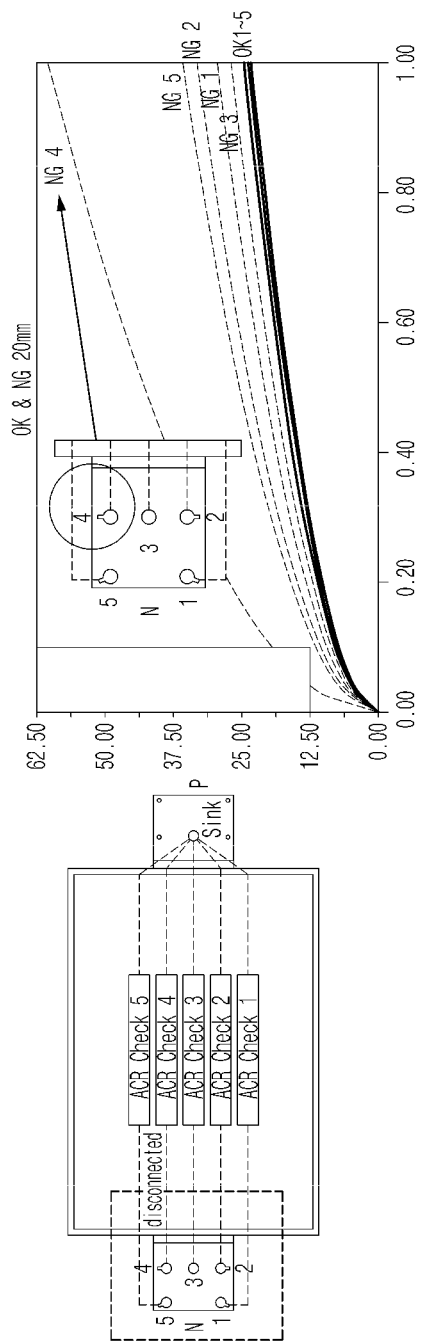
[FIG. 11]

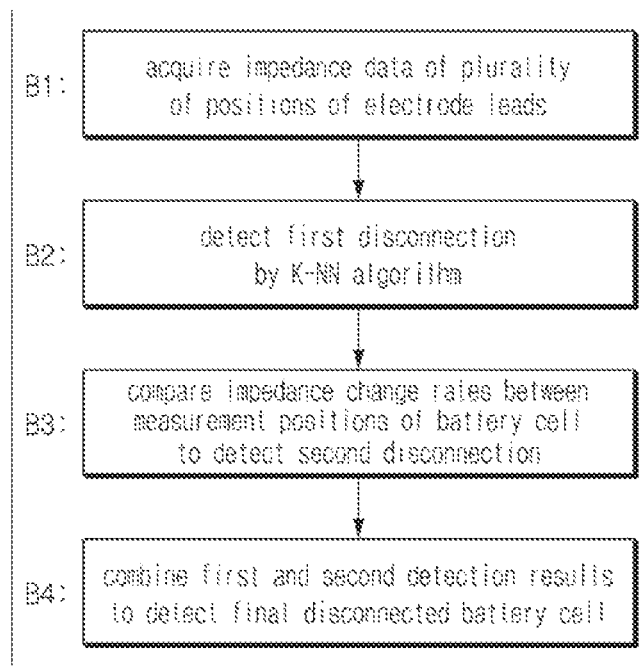
[FIG. 12]

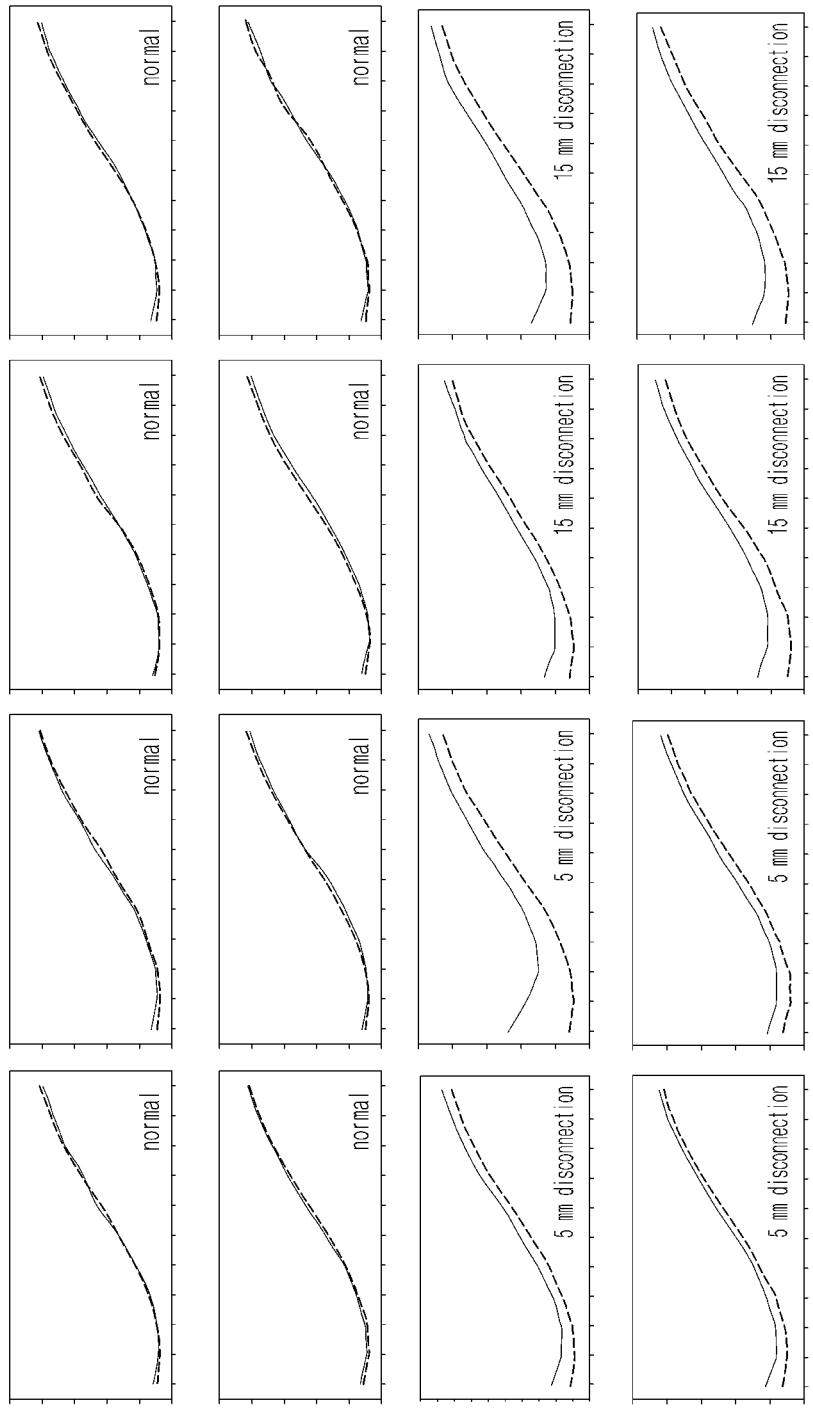
[FIG. 13]

DISCONNECTION TESTING APPARATUS FOR ELECTRODE TAB OF BATTERY CELL

TECHNICAL FIELD

The present invention relates to an electrode tab disconnection inspection apparatus for nondestructively inspecting a disconnection of an electrode tab of a battery cell.

This application claims the benefit of priority based on Korean Patent Application No. 10-2021-0142779, filed on Oct. 25, 2021, and the entire contents of the Korean patent application are incorporated herein by reference.

BACKGROUND ART

Recently, secondary batteries, which can be charged and discharged, have been widely used as energy sources of wireless mobile devices. Further, the secondary batteries have attracted attention as energy sources for an electric vehicle, a hybrid electric vehicle, and the like which have been proposed as solutions for air pollution or the like caused by an existing gasoline vehicle, a diesel vehicle, and the like using fossil fuel. Accordingly, types of applications using the secondary batteries have become much diversified due to the advantages of the secondary batteries, and it is expected that secondary batteries will be applied to more fields and products than now.

Such secondary batteries can be classified into a lithium ion battery, a lithium ion polymer battery, a lithium polymer battery, and the like according to the compositions of an electrode and an electrolyte, and among these secondary batteries, use of the lithium ion polymer battery which has a low possibility of electrolyte leakage and can be easily manufacture has increased. Generally, the secondary batteries are classified into a cylindrical battery or a prismatic battery in which an electrode assembly is accommodated in a cylindrical or prismatic metal can, and a pouch-type battery in which an electrode assembly is accommodated in a pouch-type case of an aluminum laminate sheet according to shapes of battery cases, the electrode assemblies accommodated in the battery cases are power generation elements which are each formed in a structure of a positive electrode, a negative electrode, and a separator interposed between the positive electrode and the negative electrode, and thus can be charged and discharged, and are classified into a jelly-roll type in which a separator is interposed between long sheet-type positive and negative electrodes coated with an active material and rolled, and a stacked type in which a plurality of positive and negative electrodes of a predetermined size are sequentially stacked with the separator interposed therebetween.

FIG. 1 is a schematic diagram illustrating a position where a disconnection occurs in electrode tabs 13 of a pouch-type battery cell 10.

As shown in the drawing, an electrode assembly 12 is accommodated in a battery case 11 of the pouch-type battery cell 10, and the electrode tabs 13 are drawn from this electrode assembly 12 and welded to electrode leads 14. Since the electrode tabs and welded parts of the electrode tabs, and the welded parts of the electrode tabs and the electrode leads receive forces in various directions during a manufacturing process of the battery cell, a disconnection 15 can occur at one position or several positions among welding positions. When the disconnection occurs, a defect such as a low voltage or the like can be caused.

In order to detect the disconnection of the electrode tabs, conventionally, as disclosed in Patent Document 1, a method of pressurizing a battery cell to measure an impedance change of the battery cell according to pressurization or a method of physically inspecting a welding position through CT scanning has been used.

In the technology of Patent Document 1, since a pressurizing mechanism which separately pressurizes the battery cell is required to measure the impedance change, it was difficult to apply mass production level inspection.

In addition, since CT scanning takes approximately 1 minute and 30 seconds to inspect each battery cell, again, mass production level inspection was impossible.

In order to solve the above-described problems, the present applicant developed an electrode tab disconnection method as shown in FIG. 2. That is, a tab disconnected battery cell was detected by comparing an impedance value or a real part resistance value of impedance of a battery cell to be inspected measured in a specific frequency domain (for example, a resonant frequency domain) and an impedance value or a real part resistance value of impedance in the same frequency domain of a normal battery cell without a tab disconnection and a tab disconnected battery cell.

However, even in the case of the above-described method, a region where an impedance value change region of a normal (non-defective) battery cell and an impedance value change region of a tab disconnected (defective) battery cell overlap each other occurred, and when the impedance value or the real part resistance value of the battery cell to be inspected belongs in this overlapping region, it was difficult to determine whether to determine this case as normal or a tab disconnection.

Further, there was a problem in that a tab disconnection determination result is changed according to impedance measurement positions of the electrode leads.

Accordingly, the development of an electrode tab disconnection inspection technology capable of more accurately determining whether electrode tabs of a battery cell are disconnected is desired.

RELATED ART DOCUMENT

Patent Document

Korean Patent Publication No. 10-2020-0035594

DISCLOSURE

Technical Problem

The present invention has been devised to solve the above problems, and is directed to providing an electrode tab disconnection inspection apparatus of a battery cell capable of more accurately detecting whether electrode tabs of the battery cell are disconnected based on a so-called K-nearest neighbor method (a nearest neighbor algorithm).

Further, the present invention is directed to providing an electrode tab disconnection inspection apparatus of a battery cell capable of accurately determining even whether electrode tabs are disconnected according to impedance measurement positions of electrode leads.

Technical Solution

An electrode tab disconnection inspection apparatus of a battery cell according to the present invention includes: an impedance measurement part connected to electrode leads of a battery cell to be inspected, and configured to measure an impedance value according to a frequency of the battery cell; and a determination part configured to compare impedance value data according to the frequency of the battery cell to be inspected acquired by the impedance measurement part and a predetermined impedance value data group according to a frequency of normal battery cells having no disconnected electrode tabs or a frequency of tab disconnected battery cells having disconnected electrode tabs to determine whether the electrode tabs of the battery cell to be inspected is disconnected, wherein the determination part selects a predetermined number of impedance value data points of the normal battery cells, tab disconnected battery cells, or normal and tab disconnected battery cells which are nearest neighbors to impedance value data of the battery cell to be inspected in a selected specific frequency range, and determines whether the electrode tabs of the battery cell to be inspected are disconnected according to the type of battery cell accounting for a larger number of the selected impedance value data points.

As one example, the selected predetermined number of impedance value data points may be an odd number greater than or equal to 3.

As another example, the selected specific frequency range may be a frequency range when the impedance value data points of the normal battery cells and tab disconnected battery cells do not overlap, or a frequency range when an overlapping region of the impedance value data points of the normal battery cells and tab disconnected battery cells is the smallest.

Specifically, the battery cell to be inspected may be determined to be a normal battery cell when data of the normal battery cells accounts for a larger number of the selected impedance value data points, and may be determined to be a tab disconnected battery cell when data of the tab disconnected battery cells accounts for a larger number of the selected impedance value data points.

Further, the predetermined impedance value data group according to the frequencies of the normal battery cells and the tab disconnected battery cells may be a data group repeatedly learned by a K-nearest neighbor algorithm.

As another example of the present invention, an electrode tab disconnection inspection apparatus includes: a multi-probe part including a plurality of probes corresponding to a plurality of measurement positions of electrode leads provided in a battery cell to be inspected, and in which each probe is alternatively and electrically connected to each measurement position of the electrode leads; an impedance measurement part connected to each probe of the multi-probe part and configured to measure impedance values according to frequencies for each measurement position of the electrode leads; and a determination part configured to compare impedance value data according to a frequency of the battery cell to be inspected acquired by the impedance measurement part and a predetermined impedance value data group according to a frequency of non-defective battery cells having no disconnected electrode tabs and a frequency of defective battery cells having disconnected electrode tabs to determine whether the electrode tabs of the battery cell to be inspected is disconnected, wherein, for each measurement position of the electrode lead, the determination part selects a predetermined number of impedance value data points of normal battery cells, tab disconnected battery cells, or normal and tab disconnected battery cells which are nearest neighbors to impedance value data of the battery cell to be inspected in a selected specific frequency range, and determines whether the electrode tabs respectively connected to the measurement positions of the electrode leads are disconnected according to a type of battery cell accounting for a larger number of the selected impedance value data points.

As one example, the selected predetermined number of impedance value data points may be an odd number greater than or equal to 3.

As another example, the selected specific frequency range may be a frequency range when the impedance value data points of the normal battery cells and tab disconnected battery cells do not overlap, or a frequency range when an overlapping region of the impedance value data points of the normal battery cells and tab disconnected battery cells is the smallest.

Specifically, the electrode tabs connected to corresponding measurement positions of the electrode leads may be determined as not being disconnected when data of the normal battery cells accounts for a larger number of the selected impedance value data points, and may be determined as being disconnected when data of the tab disconnected battery cells accounts for a larger number of the selected impedance value data points.

As one example, the predetermined impedance value data group according to the frequencies of the normal battery cells and the tab disconnected battery cells may be a data group repeatedly learned by a K-nearest neighbor algorithm.

As one example, the electrode tab disconnection inspection apparatus may further include a switching relay box configured to alternatively connect each probe of the multi-probe part to each measurement position, and a controller configured to control the switching relay box.

Specifically, the multi-probe part may be connected to at least one of a positive electrode lead and a negative electrode lead of the battery cell to be inspected, and the impedance values may be alternatively measured for a plurality of measurement positions of another lead of a positive electrode lead and a negative electrode lead in a state in which one probe is connected to one measurement position of one lead of the positive electrode lead and the negative electrode lead.

As one example, the plurality of measurement positions of each of the positive electrode lead and the negative electrode lead may be located at a same interval from an end of each lead or a case of the battery cell to be inspected.

The electrode tab disconnection inspection apparatus may combine a result of whether electrode tabs related to a plurality of measurement positions of one lead of a positive electrode lead and a negative electrode lead among the electrode leads are disconnected and a result of whether electrode tabs related to a plurality of measurement positions of another lead of the positive electrode lead and the negative electrode lead among the electrode leads are disconnected to determine whether all of the electrode tabs of the battery cell to be inspected are disconnected.

As another example, the determination part may additionally determine whether the electrode tabs of the battery cell to be inspected are disconnected based on a change rate of an impedance value according to each measurement position of the electrode leads, and may compare an additional determination result combined determination results of whether there is a disconnection to finally determine whether the electrode tabs of the battery cell to be inspected are disconnected.

Advantageous Effects

According to the present invention, even when it is not apparent that a battery cell is a normal battery cell or a tab disconnected battery cell, a disconnection of electrode tabs of the battery cell can be accurately detected by applying a K-nearest neighbor algorithm.

Further, whether all of the electrode tabs of the battery cell are disconnected can be more accurately determined by detecting whether electrode tabs are disconnected according to impedance measurement positions of electrode leads.

In addition, according to the present invention, not only quick and accurate inspection in an operation of manufacturing the battery cell can be performed, but also whether the battery cell has a defect (whether the electrode tabs are disconnected) in a recycling operation or a reuse operation in which a finished battery cell is used for a predetermined period and then used again can be quickly and accurately inspected. Accordingly, the defect of the battery cell can be accurately grasped during recycling of the battery cell to determine whether or not to reuse the battery cell.

BRIEF DESCRIPTION OF THE DRAWINGS

FIG. 8 is a flow chart illustrating an example of a process of detecting whether a battery cell is disconnected using the electrode tab disconnection inspection apparatus of the battery cell of the embodiment in FIG. 6.

FIGS. 9 and 10 are graphs illustrating a determination result of whether there is a disconnection in the case in which the impedance values are measured by fixing an impedance value measurement position of a negative electrode lead and changing a measurement position of a positive electrode lead.

FIG. 11 is a schematic diagram illustrating a change rate of the impedance values according to measurement positions of a normal battery cell and a tab disconnected battery cell.

FIG. 12 is a flow chart illustrating another example of detecting whether a battery cell is disconnected using the electrode tab inspection apparatus of the battery cell of the embodiment in FIG. 6.

FIG. 13 is another schematic diagram illustrating the change rate of the impedance values according to the measurement positions of the normal battery cell and the tab disconnected battery cell.

DETAILED DESCRIPTION OF THE PREFERRED EMBODIMENTS

Hereinafter, the present invention will be described in detail. Prior to this, the terms and words used in the present specification and claims should not be construed as being limited to ordinary or dictionary terms, and should be interpreted as meanings and concepts consistent with the proposed technical spirit of the present invention based on the principle that the inventor may appropriately define the concept of a term to describe the invention thereof in the best way.

In the present application, it should be understood that terms such as "include" and "have" are intended to indicate that there is a feature, number, step, operation, component, part, or a combination thereof described in the specification, but do not exclude the possibility of presence or addition of one or more other features, numbers, steps, operations, components, or combinations thereof in advance. Further, when a portion such as a layer, a film, a region, a plate, or the like is referred to as being "on" another portion, this includes not only a case in which the portion is "directly on" the other portion but also a case in which there is a still another portion therebetween. On the other hand, when a portion such as a layer, a film, a region, a plate, or the like is referred to as being "under" another portion, this includes not only a case in which the portion is "directly under" the other portion but also a case in which there is still another portion therebetween. Further, being disposed "on" in the present application may mean that something is disposed on a lower portion or on an upper portion.

Meanwhile, in the present application, "a longitudinal direction" refers to a direction in which the electrode leads of a battery cell protrude.

Figure 1:
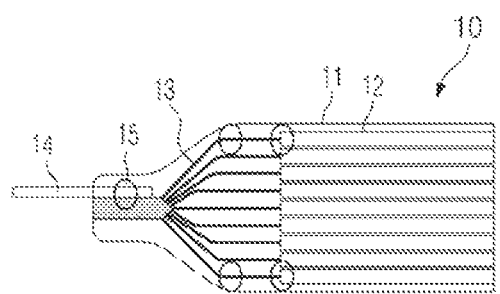
FIG. 1 is a schematic diagram illustrating a position where a disconnection occurs in electrode tabs of a pouch-type battery cell.

When electrode tabs of the battery cell are disconnected as shown in FIG. 1, it is estimated that there is a change in impedance values of the battery cell. Based on this, Patent Document 1 adopted a method of detecting whether there is a disconnection by pressurizing the battery cell to measure an impedance change.

However, as described above, the present invention is intended to detect whether there is a disconnection based on the impedance values without pressurization.

Further, the present invention is intended to accurately detect whether the tabs are disconnected even when impedance values of a normal battery cell and a tab disconnected battery cell overlap.

First Embodiment

An electrode tab disconnection inspection apparatus 100 according to the present embodiment includes: an impedance measurement part 110 connected to electrode leads 14 and 14' of a battery cell 10 to be inspected to measure an impedance value according to a frequency; and a determination part 120 which compares impedance value data according to the frequency of the battery cell 10 to be inspected acquired by the impedance measurement part 110 and a predetermined impedance value data group according to a frequency of normal battery cells having no disconnected electrode tabs or a frequency of tab disconnected battery cells having disconnected electrode tabs to determine whether the battery cell 10 to be inspected is disconnected, wherein the determination part 120 selects a predetermined number of impedance value data points of normal battery cells, tab disconnected battery cells, or normal and tab disconnected battery cells which are nearest neighbors to impedance value data of the battery cell 10 to be inspected in a selected specific frequency range, and determines whether the electrode tabs of the battery cell 10 to be inspected are disconnected according to the type of battery cell accounting for a larger number of selected data points.

Figure 3:
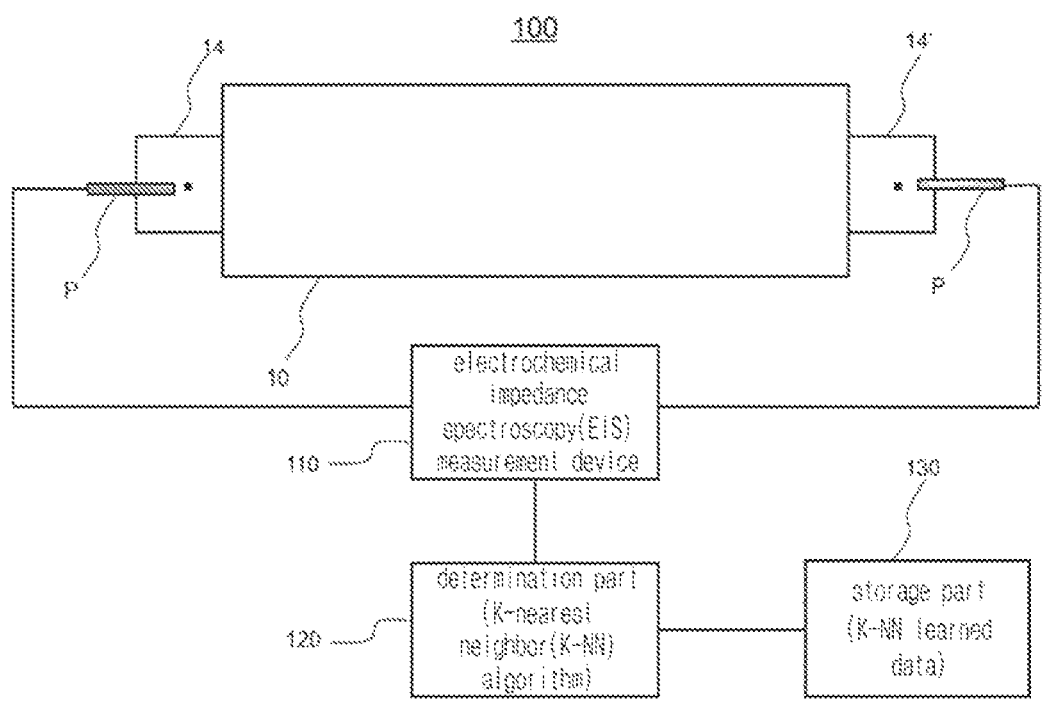
FIG. 3 is a schematic diagram of an electrode tab disconnection inspection apparatus of a battery cell according to one embodiment of the present invention.

FIG. 3 is a schematic diagram of the electrode tab disconnection inspection apparatus 100 of the battery cell according to one embodiment of the present invention.

The battery cell 10 is a pouch-type cell and is a so-called bidirectional battery cell in which electrode leads having different polarities are drawn from both end portions of the battery cell in a longitudinal direction. However, the present invention is not limited thereto, and it is possible to determine whether the electrode tabs of a battery cell that is a unidirectional battery cell in which electrode leads having different polarities are drawn from the same end portion of the battery cell are disconnected according to the present invention.

The present invention includes the impedance measurement part 110 connected to the electrode leads of the battery cell 10 to be inspected. The impedance measurement part 110 may be connected to the electrode leads of the battery cell 10 by a predetermined connection cable and connection terminal. In FIG. 3, the electrode leads 14 and 14' and the impedance measurement part 110 are connected by probes P and a conducting wire. The impedance measurement part 110 may measure the impedance value of the battery cell 10 according to the frequency. As the impedance measurement part 110, for example, when minute alternating current (AC) signals having different frequencies are applied using an electrochemical impedance spectroscopy (EIS) measurement device, the impedance value according to the frequency may be acquired. The EIS measurement device may acquire various parameters related to impedance such as a phase angle of the impedance, a real part resistance value and an imaginary part resistance value through a predetermined arithmetic operation, and the like in addition to the impedance value according to the frequency.

The electrode tab disconnection inspection apparatus 100 of the present invention compares impedance value data according to the frequency of the battery cell 10 to be inspected acquired by the impedance measurement part 110 and a impedance value data group according to frequencies of the predetermined normal battery cells and the tab disconnected battery cells to determine whether the battery cell 10 to be inspected is disconnected.

Figure 2:
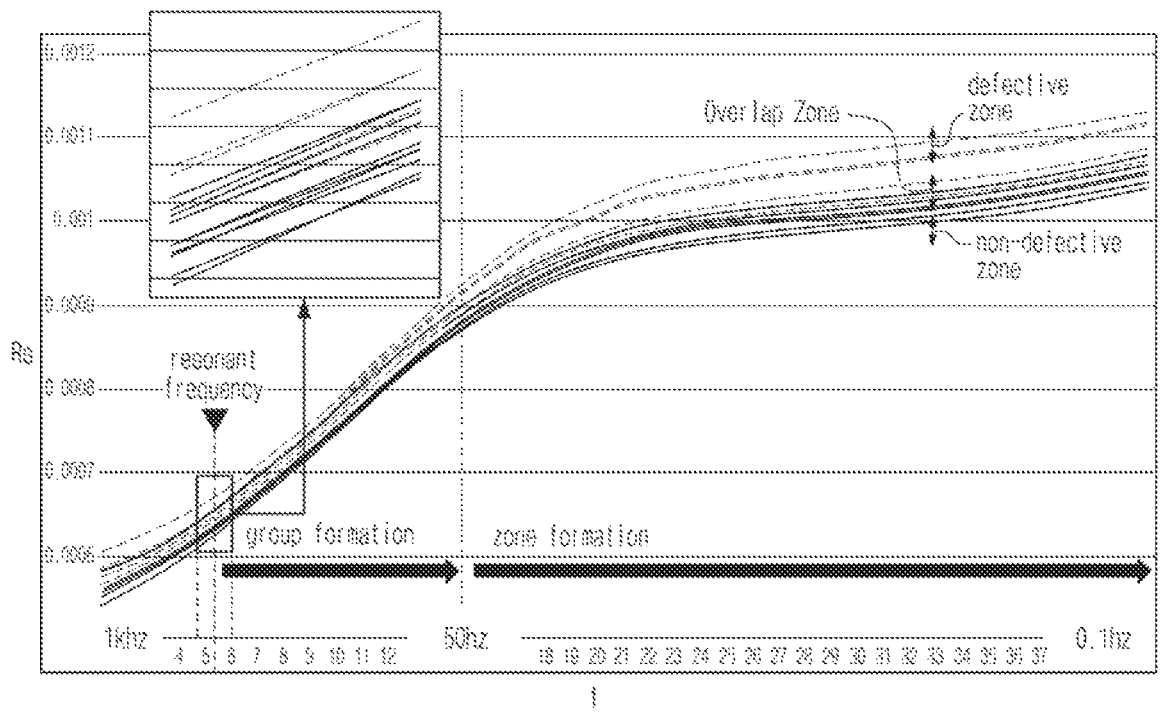
FIG. 2 is a graph illustrating a principle of detecting an electrode tab disconnection of a battery cell using an impedance value or a real part resistance value proposed by the present applicant.

The inspection apparatus 100 of the present invention is in line with the conventional technology of determining whether there is a disconnection according to comparison of impedance values in a specific frequency range proposed by the present applicant. However, as shown in FIG. 2, the conventional method may not accurately determine whether there is a disconnection for the battery cell 10 to be inspected corresponding to an overlapping region where the impedance values of the normal battery tab disconnected battery cells overlap each other. Alternatively, determining whether there is a disconnection was difficult even when it is not clear whether it belongs to the impedance value range of the normal battery cell or the impedance value range of the disconnected battery cell.

The present invention solves the above problem using a so-called K-nearest neighbor method (a K-nearest neighbor algorithm, for short, a K-NN algorithm).

Figure 4:
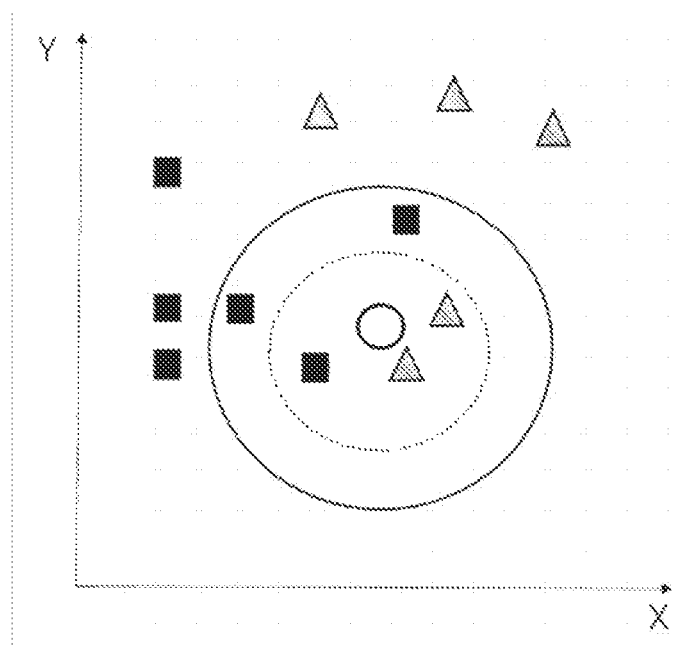
FIG. 4 is a schematic diagram for describing a principle of a K-nearest neighbor algorithm.

FIG. 4 is a schematic diagram for describing a principle of the K-NN algorithm.

The K-nearest neighbor algorithm, the K-NN algorithm for short, is a type of supervised learning which is one type of machine learning, and may be referred to as a distance-based classification and analysis model. The K-NN algorithm classifies data by referencing labels of 'K' other data points that are close to the data, and has an advantage in that the algorithm is simple and thus implementation is easy.

Specifically, when triangular data and quadrangular data are located on a predetermined coordinate plane as shown in FIG. 4, it is possible to determine which type of data to classify the circular data as belonging to. When the number of data points nearest to the circular data is determined to be 3 (that is, K is 3), the circular data is classified as belonging to the triangular data. However, when the number of nearest data points is determined to be 5 (K is 5), the circular data is classified as belonging to the quadrangular data. Accordingly, when an appropriate number of K is set, the type of data may be determined even when it is not clear to which type of data it belongs to.

The determination part 120 of the present invention selects a predetermined number of impedance values of normal battery cells, tab disconnected battery cells, or normal and tab disconnected battery cells which are nearest neighbors to impedance value data of the battery cell to be inspected, and determines whether the electrode tabs of the battery cell 10 to be inspected are disconnected according to the type of battery cell accounting for a larger number of selected data points. In the present specification, 'nearest neighbor' does not necessarily mean one data point that is the nearest neighbor. That is, the meaning of 'nearest neighbor' in the present invention corresponds to the concept of 'nearest neighbor' of the K-NN algorithm, and means that a plurality of (K) data points which are 'nearest neighbors' to specific data are selected when K data points are selected around the specific data.

In a description based on the example in FIG. 4, for example, the triangular data may be regarded as impedance value data of tab disconnected battery cells, and the quadrangular data may be regarded as impedance value data of normal battery cells. When the impedance value data of the specific frequency of the battery cell 10 to be inspected is regarded as the circular data, whether the tabs of the battery cell 10 to be inspected are disconnected may be determined according to whether the circular data belongs to the category of the dotted line circle or solid line circle in FIG. 4. That is, when K is set to 5, the impedance value data (the circular data) of the battery cell 10 to be inspected may be regarded as the impedance value data (the quadrangular data) of normal battery cells, and accordingly, the battery cell 10 to be inspected is determined to be a normal battery cell which is not disconnected. In addition, when the data of the normal battery cells accounts for a larger number of data points selected as nearest neighbors, the battery cell 10 to be inspected is determined to be a normal battery cell. That is, when K is 5 and three data points which are nearest neighbors to the impedance value data of the battery cell 10 to be inspected are data points of the normal battery cells and two are data points of the tab disconnected battery cells, the corresponding battery cell 10 to be inspected is determined to be a normal battery cell.

On the other hand, when the data of tab disconnected battery cells accounts for a larger number of selected nearest neighbor data points, the battery cell 10 to be inspected is determined to be a tab disconnected battery cell. That is, when K is 5 and three data points which are nearest neighbors to the impedance value data of the battery cell 10 to be inspected are data points of the tab disconnected battery cells and two are data points of the normal battery cells, the corresponding battery cell 10 to be inspected is determined to be a tab disconnected battery cell.

Like the above, as shown in FIG. 2, when comparing the impedance values according to the K-NN algorithm, whether there is a disconnection may be determined even when the impedance values of the normal and tab disconnected battery cells overlap each other. That is, when a predetermined number of impedance value data points are selected by selecting an appropriate K value according to the K-NN algorithm, the number of any nearest data points may be determined. Accordingly, even when the impedance values overlap each other as a whole as shown in FIG. 2, the type of an adjacent battery cell accounting for a larger number of impedance value data points with respect to the corresponding battery cell may be determined.

Meanwhile, in the present invention, the impedance value is a concept including not only a total impedance value having a real part component and an imaginary part component, but also a real part resistance value Rs. That is, when an impedance phase angle and an impedance value are known according to a relationship of R=Z COS θ, since the real part resistance value may be acquired, and the real part resistance value may also be expressed as an impedance value, whether there is a disconnection may be detected even with the resistance value of the real part component. Accordingly, the impedance value data to which the K-NN algorithm of the present invention is applied includes real part resistance value data.

Further, it is preferable that a predetermined number of impedance value data points selected for determining whether an electrode tab is disconnected, that is, a K value, is an odd number greater than or equal to 3. When K is 1, the discriminative power is low, and when the K value is an even number, it is difficult to determine where the battery cell 10 to be inspected belongs when the number of nearest data points is the same, for example, 2:2. Accordingly, the K value may be an odd number such as 3, 5, 7, or 9. However, when the K value is too large, since the discriminative power of determination is also lowered, a K value, which is not too large, should be selected. Preferably, a K value of 3 or 5 is good.

Further, the impedance value data compared to determine whether an electrode tab is disconnected may be a value in a specific frequency range.

Referring to FIG. 2, according to the frequency, there is a region where an impedance region of normal battery cells (a non-defective zone) and an impedance region of tab disconnected battery cells (a defective zone) are relatively clearly distinguished, but there is a region where an overlap zone is too large and thus it is difficult to be compared with the data of the battery cell 10 to be inspected. This wide overlap zone is mainly generated in a low-frequency domain. Further, since a position or size of the overlap zone may be changed according to a type, a physical property, and an internal state of the battery cell, an appropriate frequency range should be selected according to the battery cell.

Accordingly, the specific frequency range selected for determining whether an electrode tab is disconnected refers to a frequency range in which the impedance value data points of the normal and tab disconnected battery cells do not overlap, or an overlapping region is the smallest.

Referring to FIG. 3 again, as described above, the determination part 120 of the present invention determines whether a tab of the battery cell 10 to be inspected is disconnected by the K-NN algorithm. Meanwhile, a predetermined impedance value data group of normal and tab disconnected battery cells compared with the impedance value data of the battery cell 10 to be inspected is also a data group acquired by repeated learning by the K-NN algorithm. This data group is stored in a storage part 130 such as a predetermined database or the like, and the determination part 120 may determine whether tabs of the battery cells are disconnected by comparison with the data group in the storage part 130. As shown in FIG. 3, the storage part 130 may be provided in the form of a separate server or database (DB) from the determination part 120. Alternatively, the storage part 130 may be included in the determination part 120 as a storage part in the form of a memory. The determination part 120 may be a predetermined computing device in which software having the K-NN algorithm implemented therein is embedded.

Figure 5:
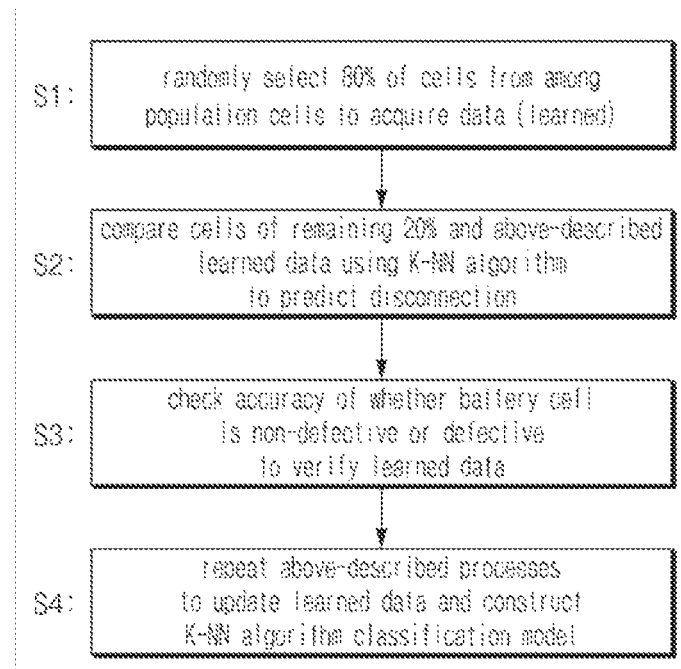
FIG. 5 is a flow chart illustrating a data learning process according to the K-nearest neighbor algorithm.

FIG. 5 is a flow chart illustrating an example of a data learning process according to the K-nearest neighbor algorithm.

For example, a predetermined number of battery cells in which tabs of positive electrodes or negative electrodes are artificially disconnected are manufactured, and a predetermined number of battery cells (for example, 100 battery cells) of a population for data group creation may be prepared by mixing the tab disconnected battery cells with normal battery cells of the same type. The impedance value data according to the frequencies of the normal battery cell and the tab disconnected battery cell is learned and set as a predetermined data group of a comparison target by randomly selecting 80% of the battery cells (for example, 80 battery cells) from among the cells of the population, and measuring the impedance value data of the selected battery cells (S1).

Whether each of the battery cells of the remaining 20% is disconnected is predicted as much as a predetermined times by measuring impedance values of the battery cells of the remaining 20% (for example, 20 battery cells) to compare the battery cells of the remaining 20% with the data group of the comparison target using the K-NN algorithm (S2).

Next, a predicted result and whether the battery cells are actually normal and tab disconnected battery cells are verified (S3).

TABLE 1

| Cell ID | Number of times of being predicted | Number of times of being predicted as disconnection | Number of times of being predicted as normal | Actual battery cell |
|---------|------|------|------|------|
| 11360 | 25 times | 0 | 25 | normal battery cell |
| 11361 | 17 times | 0 | 17 | normal battery cell |
| 22464 | 23 times | 23 | 0 | tab disconnected battery cell |
| 22465 | 23 times | 23 | 0 | tab disconnected battery cell |

From Table 1, when the K-NN algorithm predicts whether a battery cell of a specific cell ID is normal or disconnected based on the impedance value data group of the selected 80% of the battery cell population, it can be seen that whether electrode tabs are disconnected may be predicted with 100% accuracy. Of course, according to the selected data group, the prediction result may not have 100% accuracy, and may have different accuracies, such as 90%, 95%, or the like. Like the above, the data whose accuracy has been verified is updated as learning data for predicting a tab disconnection.

Further, in order to increase the accuracy of the data group, this data learning process may be repeated, for example, 100 times, to acquire a more reliable and accurate comparison data group for the K-NN algorithm (S4).

Second Embodiment

An electrode tab disconnection inspection apparatus 200 according to the present embodiment includes: a multi-probe part 240 including a plurality of probes P1, P2, and P3 corresponding to a plurality of measurement positions of electrode leads 14 and 14' provided in a battery cell 10 to be inspected, and in which each of the probes P1, P2, and P3 is alternatively and electrically connected to each measurement positions; an impedance measurement part 210 connected to each of the probes P1, P2, and P3 of the multi-probe part 240 to measure impedance values according to frequencies for each measurement position of the electrode leads; and a determination part 220 which compares impedance value data according to the frequency of the battery cell 10 to be inspected acquired by the impedance measurement part 210 and a predetermined impedance value data group according to a frequency of non-defective battery cells having no disconnected electrode tabs and a frequency of defective battery cells having disconnected electrode tabs to determine whether the battery cell 10 to be inspected is disconnected, wherein, for each measurement position of the electrode lead, the determination part 220 selects a predetermined number of impedance value data points of normal battery cells, tab disconnected battery cells, or normal and tab disconnected battery cells which are nearest neighbors to impedance value data of the battery cell 10 to be inspected in a selected specific frequency range, and determines whether the electrode tabs respectively connected to the measurement positions of the electrode leads are disconnected according to the type of battery cell accounting for a larger number of selected data points.

Figure 6:
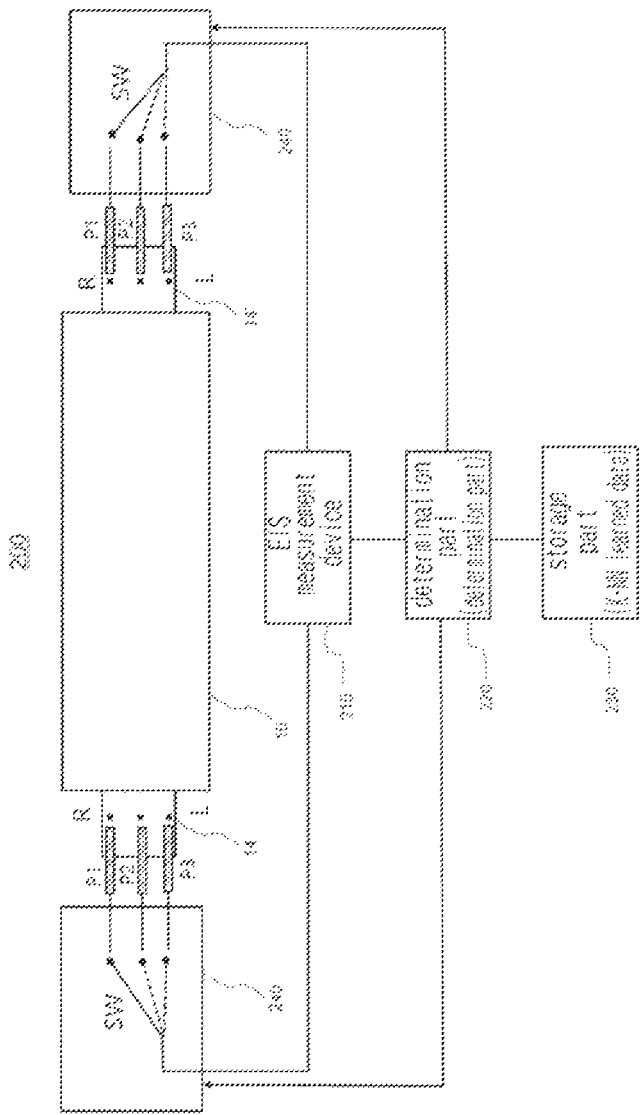
FIG. 6 is a schematic diagram of an electrode tab disconnection inspection apparatus of a battery cell according to another embodiment of the present invention.

FIG. 6 is a schematic diagram of the electrode tab disconnection inspection apparatus 200 of the battery cell according to the second embodiment.

The electrode tab disconnection inspection apparatus 200 of the present embodiment includes the multi-probe part 240. The multi-probe part 240 includes the plurality of probes P1, P2, and P3 at positions corresponding to the plurality of measurement positions of the electrode leads provided at both ends of a pouch-type battery cell in a longitudinal direction. As shown in FIG. 1, the electrode leads are connected to a plurality of tab bundles. Even when a specific tab is disconnected, tabs at other positions may be normal, and when the impedance value is measured at positions of the electrode leads connected to the normal tabs, the value may be measured as the impedance value of the normal battery cell. Accordingly, when the impedance value is measured at only one measurement position of the electrode lead, a case in which defective battery cells are shipped to the market may occur.

In order to prevent the above case, the invention of the present embodiment includes the multi-probe part 240 so that the impedance values may be measured at several positions of the electrode leads using the plurality of probes P1, P2, and P3. However, the impedance is not measured using the plurality of probes P1, P2, and P3 all at one time, and since the probes P1, P2, and P3 are alternatively and electrically connected to the measurement positions, respectively, impedance values at specific positions may be sequentially measured.

Further, the inspection apparatus 200 of the present invention includes the impedance measurement part 210 connected to each of the probes P1, P2, and P3 of the multi-probe part 240 to measure impedance values according to frequencies for each measurement position of the electrode leads 14 and 14'. An EIS measurement device 210 may be used as the impedance measurement part 210. Since the impedance measurement part 210 was sufficiently described in the first embodiment, detailed descriptions thereof will be omitted in the present embodiment.

The determination part 220 of the present embodiment may also determine whether the electrode tab is disconnected for each measurement position of the electrode leads 14 and 14' by the K-NN algorithm as shown in the first embodiment. Unlike the first embodiment, since the present embodiment includes the plurality of probes P1, P2, and P3 alternately and electrically connected to the measurement positions, respectively, the K-NN algorithm may be applied to each measurement position. Accordingly, the present embodiment may determine whether the battery cells are normal or disconnected by comparison with the predetermined impedance value data group according to the frequency of the normal or tab disconnected battery cells for each of the measurement positions of the electrode leads. In this case, for the same comparison, the predetermined impedance value data group compared with the impedance values measured at the specific positions of the electrode leads 14 and 14' should also be measured at the same positions as the specific positions of the corresponding electrode leads.

Further, the predetermined number of impedance value data points selected for determining nearest neighbors may be an odd number greater than or equal to 3 like the first embodiment. In addition, the frequency of the impedance value data group compared with the impedance value data to be inspected for each measurement position should be selected from a range where the impedance value data points of normal and tab disconnected battery cells do not overlap as much as possible like the first embodiment.

Determining whether the electrode tab of each measurement position of the present embodiment is disconnected is performed by the K-NN algorithm as follows.

The electrode tabs connected to the corresponding measurement positions of the electrode leads are determined as not being disconnected when data points of the normal battery cells account for a larger number of nearest neighbor data points selected for the impedance value measured at each measurement position.

The electrode tabs connected to the corresponding measurement positions of the electrode leads are determined as being disconnected when data points of the tab disconnected battery cells account for a larger number of nearest neighbor data points selected for the impedance value measured at each measurement position.

In this case, the predetermined impedance value data group according to the frequencies of the normal battery cells and the tab disconnected battery cells to be compared is also a data group repeatedly learned by the K-NN algorithm as shown in FIG. 5.

This data group is stored in a storage part 230 such as a predetermined database or the like, and the determination part 220 may determine whether the tabs of the battery cells are disconnected by comparison with the data group in the storage part 230. As shown in FIG. 6, the storage part 230 may be provided in the form of a separate server or DB from the determination part 220. Alternatively, the storage part 130 may be included in the determination part 220 as a storage part in the form of a memory. The determination part 220 may be a predetermined computing device in which software having the K-NN algorithm implemented therein is embedded.

In order to alternately and electrically connect the plurality of probes P1, P2, and P3 to the measurement positions, respectively, the electrode tab disconnection inspection apparatus 200 of the present embodiment may include a switching relay box 250. The switching relay box 250 is connected to each of the probes P1, P2, and P3 of the multi-probe part 240 by a circuit, and includes a switch or relay (SW) which electrically switches and electrically connects each of the probes P1, P2, and P3. Since this electrical relay mechanism is commonly known, descriptions thereof will be omitted. When the multi-probe part 240 is connected to at least one of the battery cell positive and negative electrode leads 14 and 14' having different polarities, impedance values related to a plurality of measurement positions in each lead may be measured using the EIS measurement device 210.

Further, a controller, which controls the switching relay box 250 so that the probes P1, P2, and P3 are alternately connected to each measurement position, may be provided. The controller may be separate from the determination part 220 or may include the determination part 220 as shown in FIG. 6. In the latter case, the controller may be a control computer having the determination part 220 in which software having the K-NN algorithm implemented therein is embedded.

In FIG. 6, the impedance values are measured for each of three measurement positions of the electrode leads. However, the number of measurement positions may be 2, 4, 5 or more as necessary. In FIG. 6, R and L refer to right and left sides of the electrode lead. Specifically, a disconnection mostly occurs at tab portions adjacent to both side portions of the electrode lead. In consideration of this, the embodiment in FIG. 6 illustrates measuring the impedance values at both side portions R and L of the electrode lead. The measurement positions may be set to the same standard. For example, when the measurement positions are set to be side by side at the same interval based on an end of each of the leads 14 and 14' or the battery cell case, impedance may be measured and compared under relatively the same conditions for each measurement position.

In the switching relay box 250 in FIG. 6, a dotted line indicates that the switch SW is not connected, and a solid line indicates that the switch SW is connected. Accordingly, FIG. 6 illustrates measuring impedance values at the measurement positions of R positions of both the positive and negative electrode leads 14 and 14'. Due to switching of the relay box 250, impedance values at other measurement positions may also be measured.

Figure 7:
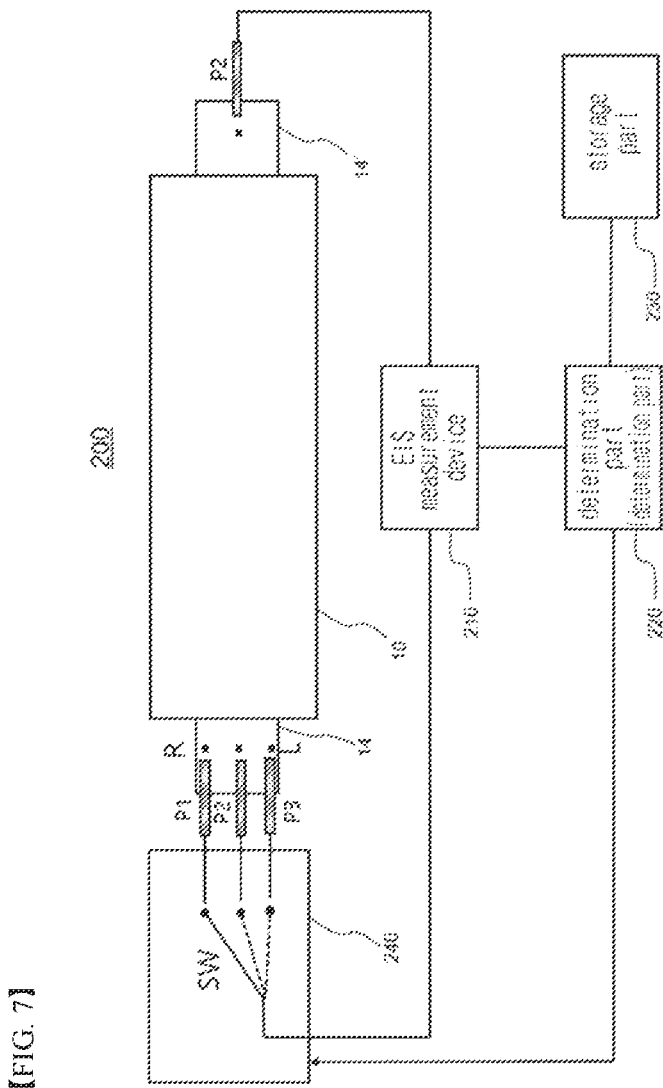
FIG. 7 is a schematic diagram illustrating an example of measuring impedance values according to measurement positions of electrode leads of the battery cell.

When measuring impedance values at a plurality of positions of one electrode lead, measurement positions of other electrode leads need to be fixed. This is because it is possible to objectively compare whether tabs are disconnected at a plurality of positions of one electrode lead. FIG. 7 is a schematic diagram illustrating a case of such a measurement state. Referring to FIG. 7, impedance values are alternately measured by fixing the measurement position of the right electrode lead 14' (for example, the negative electrode lead) to one central position, and setting the measurement positions of the left electrode lead 14 (for example, the positive electrode lead) to two positions R and L. Accordingly, it is possible to objectively compare whether the tab at positions R of the positive electrode lead 14 is disconnected and whether the tab at position L of the positive electrode lead 14 is disconnected, and when any one position is sensed as a disconnection, the battery cell is determined to be a tab disconnected battery cell. In FIG. 7, for convenience of illustration, only one probe is indicated in the sense that the measurement position of the electrode lead 14' on the right side is fixed to one position. However, as shown in FIG. 6, only one probe may be electrically connected to the corresponding measurement position by switching. Contrary to FIG. 7, whether electrodes tabs connected to the negative electrode lead are disconnected may be detected by fixing the measurement position of the positive electrode lead 14 on the left side to one central position, and measuring impedance values for two positions R and L of the negative lead 14' on the right side. Like the above, impedance is measured by alternately and electrically connecting the probes P1, P2, and P3 of the multi-probe part 240 to the measurement positions of the electrode lead, respectively, and the corresponding battery cell 10 to be inspected is determined to be a normal battery cell only when all of the impedance values of each measurement point correspond to the impedance values of a normal battery cell, and is determined to be a tab disconnected battery cell when the impedance value of one position belongs to the impedance value of a tab disconnected battery cell.

FIG. 8 is a flow chart illustrating an example of a process of detecting whether a battery cell is disconnected using the electrode tab disconnection inspection apparatus of the battery cell of the embodiment in FIG. 6.

First, impedance value data of a plurality of positions of the electrode lead is acquired by the impedance measurement part 210.

For example, as shown in FIG. 7, the measurement position of the negative electrode lead 14' is fixed, and the impedance value data of positions L and R of the positive electrode lead 14 is acquired. Next, the measurement position of the positive electrode lead 14 is fixed, and the impedance value data of positions L and R of the negative electrode lead 14' is acquired (A1).

Next, the impedance value data for each position and a comparison impedance value data group at the same position learned by, for example, the K-NN algorithm, are compared by a nearest neighbor algorithm to detect a tab disconnection at the corresponding position (A2).

In this case, even when the disconnection is not detected at a specific position, the disconnection may be detected at other positions. Accordingly, since cases in which the tab disconnection is not detected may be reduced by combining disconnection detection results at several positions, the disconnection is detected by combining the measured detection results at the positions (A3).

Finally, whether all battery cells are disconnected may be determined based on the combined detection results (A4).

The following Table 2 shows the detection of a disconnection of all of the electrode tabs of the battery cell 10 to be inspected by combining a result of whether the electrode tabs related to the plurality of measurement positions R and L of the positive electrode lead 14 are disconnected and a result of whether the electrode tabs related to the plurality of measurement positions R and L of the negative electrode lead 14' are disconnected.

TABLE 2

Selected frequency range: 100-160 Hz (analysis of 2 measurement positions)/K = 5

| Test conditions | K-NN determination result | 1 + 2/ 3 + 4 combination result |
| --- | --- | --- |
| 1. 27 normal products versus 27 positive electrode disconnections (fixed negative electrode lead position and positive electrode lead L measurement) | not detected: three | not detected: one |
| 2. 27 normal products versus 27 positive electrode disconnections (fixed negative electrode lead position and positive electrode lead R measurement) | not detected: four | |

TABLE 2-continued

Selected frequency range: 100-160 Hz (analysis of 2 measurement positions)/K = 5

| Test conditions | K-NN determination result | 1 + 2/ 3 + 4 combination result |
|---|---|---|
| 3. 27 normal products versus 27 negative electrode disconnections (fixed positive electrode lead position and negative electrode lead L measurement) | not detected: three | not detected: one |
| 4. 27 normal products versus 27 negative electrode disconnections (fixed positive electrode lead position and negative electrode lead R measurement) | not detected: four | |

FIGS. 9 and 10 are graphs illustrating a determination result of whether there is a disconnection in the case in which the impedance values are measured by fixing an impedance value measurement position of the negative electrode lead 14' and changing the measurement position of the positive electrode lead 14. That is, FIGS. 9 and 10 illustrate that the number of undetected cases is reduced by a combination of determination results of cases 1 and 2 in Table 2.

FIG. 9 illustrates a result of measuring a real part resistance R at frequencies of 21 points in a frequency range of 1 kHz to 0.1 Hz for 27 normal product (non-defective) battery cells and 27 battery cells in which positions L of the positive electrode lead 14 are disconnected. As shown in the drawing, impedance value data groups of the normal product and the disconnected battery cell overlap in a high-frequency domain and a low-frequency domain, making it difficult to become comparison data groups for determining whether the battery cell 10 to be inspected is normal. In FIG. 9, since there is relatively little overlap between 160 Hz to 100 Hz, disconnection was detected by the K-NN algorithm in this frequency range. For convenience of illustration, frequency (f)-real part resistance R coordinate data points were connected with a line, but as described above, actually, the frequency-real part resistance data of 21 points was acquired using the EIS measurement device 210 and compared using the K-NN algorithm. Since the present experiment was performed by acquiring (learning) impedance value data using battery cells which are known to be normal cells or tap disconnected battery cells in advance, tap disconnected battery cells which are not detected even by the above-described detection method may be grasped. As shown in FIG. 9, three disconnected battery cells having cell IDs 12672, 12684, and 12710 were determined to be non-defective battery cells and thus were not detected.

FIG. 10 illustrates a result of measuring a real part resistance R at frequencies of 21 points in a frequency range of 1 kHz to 0.1 Hz for 27 normal product (non-defective) battery cells and 27 battery cells in which the positions R of the positive electrode lead 14 are disconnected. Disconnection was detected again by the K-NN algorithm in the frequency range of 160 Hz to 100 Hz. According to the detection result, four disconnected battery cells having cell IDs 12710, 12705, 12664, and 12671 were determined to be non-defective battery cells and thus were not detected.

When the determination results in FIGS. 9 and 10 are combined, only the disconnected battery cell having cell ID 12710 was not detected. That is, as shown in Table 2, when the test results of 1 and 2 are combined, since there is one undetected disconnected battery cell among 54 battery cells, disconnection detection accuracy or efficiency may be greatly improved.

Further, according to the result in which the position of the positive electrode lead 14 is fixed, and the measurement positions of the negative electrode lead 14' are classified into L and R to detect whether tabs are disconnected, and determination is performed by a combination thereof, since there is only one undetected disconnected battery cell like FIGS. 9 and 10, detection accuracy is also improved.

Meanwhile, when impedance values are measured at several measurement positions in a multi-point manner as shown in the present embodiment, impedance value change rates of the normal battery cell and the tab disconnected battery cell are shown differently according to the measurement positions.

FIG. 11 is a schematic diagram illustrating the change rate of the impedance values according to the measurement positions of the normal battery cell and the tab disconnected battery cell.

FIG. 11 illustrates an impedance value change rate according to a frequency for each position while fixing the measurement position of the positive electrode lead (P:14) and changing the measurement positions of the negative electrode lead (N:14') to five.

As shown in the drawing, in the case of the normal battery cell, it can be seen that the impedance value change rates at the five positions are almost the same. However, in the case of the tab disconnected battery cell, it can be seen that the impedance value is generally higher than that of the normal battery cell, and the change rates thereof are also different from each other. Specifically, it can be seen that the impedance value change rate at the fourth position where the tap disconnection occurs is greatly different from the impedance value change rates at the other positions.

From this, in the invention of the present embodiment which determines whether tabs are disconnected using the impedance values of a plurality of positions of the electrode lead, whether the electrode tabs are disconnected is additionally determined using the impedance value change rate by this multi-point measurement, and when this additional determination result and the determination result of whether the electrode tabs are disconnected determined by the K-NN method are combined, it is determined that the tap disconnection detection result may be further improved.

FIG. 12 is a flow chart illustrating another example of detecting whether a battery cell is disconnected using the electrode tab disconnection inspection apparatus of the battery cell of the embodiment in FIG. 6.

First, impedance value data of each of a plurality of positions of the electrode lead is acquired using the electrode tab inspection apparatus shown in FIG. 6 (B1).

Next, whether each measurement position is disconnected is firstly detected by comparing the impedance value data with the predetermined impedance value data groups of the normal battery cell and the tab disconnected battery cell using the K-NN algorithm (B2). In this case, as shown in FIG. 8, determination results of whether several positions are disconnected may be combined to improve detection accuracy.

Next, in the corresponding electrode lead, whether each battery cell is disconnected is secondarily detected by comparing the change rates of the impedance value data of the plurality of positions according to each measurement position (B3). That is, the detection result of B2 may be verified based on the detection result of B3.

Finally, a final disconnected battery cell may be detected by combining the first and second detection results. Since determining whether there is a disconnection based on the change rate of the impedance value according to the measurement position has a different approach from determining whether there is a disconnection by the above-described K-NN algorithm, the first and second detection results may be the same or may also be partially different. When the first and second detection results are partially different, since undetected battery cells may be additionally found, detection accuracy may be improved.

FIG. 13 is another schematic diagram illustrating the change rate of the impedance values according to the measurement positions of the normal battery cell and the tab disconnected battery cell.

Two lines shown in each graph in FIG. 13 are measurement of the real part resistance values according to each of the frequencies for positions L and R of the positive electrode lead.

As shown in the drawing, the eight normal battery cells at the top have a slight difference in the impedance value change rates according to the measurement positions, but a large difference in the impedance value change rates according to the measurement positions is shown in the tab disconnected battery cells at the bottom. From this, it can be seen that a method of measuring a impedance value by changing a measurement position in a multi-point probing manner and then detecting a tab disconnected battery cell from the change rate also shows significant accuracy.

Accordingly, detection accuracy may be further improved by inspecting whether tabs of the battery cell are disconnected according to the flow chart shown in FIG. 12.

According to the present invention, not only quick and accurate inspection in an operation of manufacturing the battery cell may be performed, but also whether the battery cell has a defect (whether electrode tabs are disconnected) in a recycling operation or a reuse operation in which a finished battery cell is used for a predetermined period and then used again may be quickly and accurately inspected. Accordingly, the defect of the battery cell may be quickly grasped during recycling of the battery cell to determine whether or not to reuse the battery cell.

The above description is only an exemplary description of the technical spirit of the present invention, and various modifications and variations may be made by those skilled in the art without departing from essential characteristics of the present invention. Accordingly, the drawings disclosed in the present invention are provided not to limit but to describe the technical spirit of the present invention, and the scope of the technical spirit of the present invention is not limited by these drawings. The scope of the present invention should be interpreted by the claims to be described below, and it should be interpreted that all technical spirit within the equivalent range are included in the scope of the present invention.

Meanwhile, terms which indicate directions such as upward, downward, leftward, rightward, frontward, and backward are used in the present specification, but it is apparent that these terms are only for convenience of description and may be changed according a position of a target object, a position of an observer, or the like.

REFERENCE NUMERALS

10: battery cell
11: battery case
12: electrode assembly
13: electrode tab
14: electrode lead
15: disconnected portion
100: electrode tab disconnection inspection apparatus of battery cell
110: impedance measurement part
120: determination part
130: storage part
P: probe
14 and 14': electrode lead
200: electrode tab disconnection inspection apparatus of battery cell
210: impedance measurement part
220: controller (determination part)
230: storage part
240: multi-probe part
250: switching relay box
SW: switch or relay
P1, P2, and P3: probes according to measurement positions

The invention claimed is:

1. An electrode tab disconnection inspection apparatus comprising:
   an impedance measurement part connected to electrode leads of a battery cell to be inspected, and configured to measure an impedance value according to a frequency of the battery cell; and
   a determination part configured to compare impedance value data according to the frequency of the battery cell to be inspected acquired by the impedance measurement part and a predetermined impedance value data group according to a frequency of normal battery cells having no disconnected electrode tabs or a frequency of tab disconnected battery cells having disconnected electrode tabs to determine whether the electrode tabs of the battery cell to be inspected is disconnected,
   wherein the determination part selects a predetermined number of impedance value data points of the normal battery cells, tab disconnected battery cells, or normal and tab disconnected battery cells which are nearest neighbors to impedance value data of the battery cell to be inspected in a selected specific frequency range, and determines whether the electrode tabs of the battery cell to be inspected are disconnected according to a type of battery cell accounting for a larger number of the selected impedance value data points.

2. The electrode tab disconnection inspection apparatus of claim 1, wherein the selected predetermined number of impedance value data points is an odd number greater than or equal to 3.

3. The electrode tab disconnection inspection apparatus of claim 1, wherein the selected specific frequency range is a frequency range when the impedance value data points of the normal battery cells and tab disconnected battery cells do not overlap, or a frequency range when an overlapping region of the impedance value data points of the normal battery cells and tab disconnected battery cells is the smallest.

4. The electrode tab disconnection inspection apparatus of claim 1, wherein the battery cell to be inspected is determined to be a normal battery cell-when the when data of the normal battery cells accounts for a larger number of the selected impedance value data points, and is determined to be a tab disconnected battery cell when data of the tab disconnected battery cells accounts for a larger number of the selected impedance value data points.

5. The electrode tab disconnection inspection apparatus of claim 1, wherein the predetermined impedance value data group according to the frequencies of the normal battery cells and the tab disconnected battery cells is a data group repeatedly learned by a K-nearest neighbor algorithm.

6. An electrode tab disconnection inspection apparatus comprising:
a multi-probe part including a plurality of probes corresponding to a plurality of measurement positions of electrode leads provided in a battery cell to be inspected, and in which each probe is alternatively and electrically connected to each measurement position of the electrode leads;
an impedance measurement part connected to each probe of the multi-probe part and configured to measure impedance values according to frequencies for each measurement position of the electrode leads; and
a determination part configured to compare impedance value data according to a frequency of the battery cell to be inspected acquired by the impedance measurement part and a predetermined impedance value data group according to a frequency of non-defective battery cells having no disconnected electrode tabs or a frequency of defective battery cells having disconnected electrode tabs to determine whether the electrode tabs of the battery cell to be inspected is disconnected,
wherein, for each measurement position of the electrode lead, the determination part selects a predetermined number of impedance value data points of normal battery cells, tab disconnected battery cells, or normal and tab disconnected battery cells which are nearest neighbors to impedance value data of the battery cell to be inspected in a selected specific frequency range, and determines whether the electrode tabs respectively connected to the measurement positions of the electrode leads are disconnected according to a type of battery cell accounting for a larger number of the selected impedance value data points.

7. The electrode tab disconnection inspection apparatus of claim 6, wherein the selected predetermined number of impedance value data points is an odd number greater than or equal to 3.

8. The electrode tab disconnection inspection apparatus of claim 6, wherein the selected specific frequency range is a frequency range when the impedance value data points of the normal battery cells and tab disconnected battery cells do not overlap, or a frequency range when an overlapping region of the impedance value data points of the normal battery cells and tab disconnected battery cells is the smallest.

9. The electrode tab disconnection inspection apparatus of claim 6, wherein the electrode tabs connected to corresponding measurement positions of the electrode leads are determined as not being disconnected when data of the normal battery cells accounts for a larger number of the selected impedance value data points, and are determined as being disconnected when data of the tab disconnected battery cells accounts for a larger number of the selected impedance value data points.

10. The electrode tab disconnection inspection apparatus of claim 6, wherein the predetermined impedance value data group according to the frequencies of the normal battery cells and the tab disconnected battery cells is a data group repeatedly learned by a K-nearest neighbor algorithm.

11. The electrode tab disconnection inspection apparatus of claim 6, further comprising:
a switching relay box configured to alternatively connect each probe of the multi-probe part to each measurement position; and
a controller configured to control the switching relay box.

12. The electrode tab disconnection inspection apparatus of claim 11, wherein the multi-probe part is connected to at least one of a positive electrode lead and a negative electrode lead of the battery cell to be inspected, and the impedance values are alternatively measured for a plurality of measurement positions of another lead of a positive electrode lead and a negative electrode lead in a state in which one probe is connected to one measurement position of one lead of the positive electrode lead and the negative electrode lead.

13. The electrode tab disconnection inspection apparatus of claim 11, wherein the plurality of measurement positions of each of the positive electrode lead and the negative electrode lead are located at a same interval from an end of each lead or a case of the battery cell to be inspected.

14. The electrode tab disconnection inspection apparatus of claim 6, wherein the electrode tab disconnection inspection apparatus combines a result of whether electrode tabs related to a plurality of measurement positions of one lead of a positive electrode lead and a negative electrode lead among the electrode leads are disconnected and a result of whether electrode tabs related to a plurality of measurement positions of another lead of the positive electrode lead and the negative electrode lead among the electrode leads are disconnected to determine whether all of the electrode tabs of the battery cell to be inspected are disconnected.

15. The electrode tab disconnection inspection apparatus of claim 14, wherein the determination part additionally determines whether the electrode tabs of the battery cell to be inspected are disconnected based on a change rate of an impedance value according to each measurement position of the electrode leads, and compares an additional determination result and combined determination results of whether there is a disconnection to finally determine whether the electrode tabs of the battery cell to be inspected are disconnected.

* * * * *